(12) United States Patent  
Sakuta et al.

(10) Patent No.: US 8,779,455 B2  
(45) Date of Patent: Jul. 15, 2014

(54) SEMICONDUCTOR LIGHT-EMITTING DEVICE, SEMICONDUCTOR LIGHT-EMITTING SYSTEM AND ILLUMINATION FIXTURE

(71) Applicant: Mitsubishi Chemical Corporation, Chiyoda-ku (JP)

(72) Inventors: Hiroaki Sakuta, Odawara (JP); Yuki Kohara, Chiyoda-ku (JP); Yoshihito Satou, Ushiku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 13/673,568

(22) Filed: Nov. 9, 2012

(65) Prior Publication Data

US 2013/0082289 A1 Apr. 4, 2013

Related U.S. Application Data

(63) Continuation of application No. PCT/JP2012/058398, filed on Mar. 29, 2012.

(30) Foreign Application Priority Data

Jun. 2, 2011 (JP) ................. 2011-124596  
Mar. 1, 2012 (JP) ................. 2012-045422

(51) Int. Cl.  
*H01L 33/00* (2010.01)

(52) U.S. Cl.  
USPC ...... 257/98; 257/100; 257/E33.061; 313/501; 313/503; 252/301.4 F; 438/22; 438/38

(58) Field of Classification Search  
USPC .............. 257/88, 89, 98, 99, 100, 103; 313/501–503; 252/33.061, 301.4 F, 252/301.4 H; 438/22, 35, 38, FOR. 157, 438/FOR. 293  
See application file for complete search history.

(56) References Cited

U.S. PATENT DOCUMENTS 6,656,608 B1 12/2003 Kita et al.  
7,564,180 B2 7/2009 Brandes  
(Continued)

FOREIGN PATENT DOCUMENTS

JP 2004-119634 A 4/2004  
JP 2004-128443 A 4/2004  
(Continued)

OTHER PUBLICATIONS

International Search Report issued May 1, 2012 in PCT/JP2012/058398.

(Continued)

*Primary Examiner* — Su Kim  
(74) *Attorney, Agent, or Firm* — Oblon, Spivak, McClelland, Maier & Neustadt, L.L.P.

(57) ABSTRACT

The present invention provides a semiconductor light-emitting device that emits light with a specific low correlated color temperature and with a high Ra, and a semiconductor light-emitting system provided with the semiconductor light-emitting device. This object is attained by the semiconductor light-emitting device having the below-described configuration.

A semiconductor light-emitting device includes a LED chip as a semiconductor light-emitting element, and a phosphor emitting light using the LED chip as an excitation source, and emits light with a correlated color temperature equal to or higher than 1600 K and lower than 2400 K. The phosphor includes at least a green phosphor and a red phosphor. In the spectrum of light emitted from the semiconductor light-emitting device, the value of the peak intensity of the light emitted by the LED chip is less than 60% of the maximum peak intensity of the light emitted by the phosphor.

15 Claims, 10 Drawing Sheets

(56) References Cited

U.S. PATENT DOCUMENTS

| | | |
|---|---|---|
| 2004/0058195 A1 | 3/2004 | Kita et al. |
| 2004/0062951 A1 | 4/2004 | Kita et al. |
| 2004/0072019 A1 | 4/2004 | Kita et al. |
| 2004/0096696 A1 | 5/2004 | Kita et al. |
| 2006/0045832 A1 | 3/2006 | Nagatomi et al. |
| 2006/0226759 A1* | 10/2006 | Masuda et al. ............... 313/486 |
| 2007/0020485 A1 | 1/2007 | Kita et al. |
| 2007/0223219 A1 | 9/2007 | Medendorp, Jr. et al. |
| 2007/0278510 A1 | 12/2007 | Sakuma et al. |
| 2008/0105887 A1 | 5/2008 | Narendran et al. |
| 2009/0050907 A1 | 2/2009 | Yuan et al. |
| 2009/0050908 A1 | 2/2009 | Yuan et al. |
| 2009/0108281 A1 | 4/2009 | Keller et al. |
| 2009/0195137 A1 | 8/2009 | Brandes |
| 2009/0207583 A1 | 8/2009 | Takano |
| 2009/0243467 A1 | 10/2009 | Shimizu et al. |
| 2009/0267484 A1 | 10/2009 | Kasakura et al. |
| 2010/0102704 A1* | 4/2010 | Jermann et al. ............... 313/487 |
| 2010/0252851 A1 | 10/2010 | Emerson et al. |
| 2011/0012143 A1 | 1/2011 | Yuan et al. |
| 2011/0050125 A1 | 3/2011 | Medendorp, Jr. et al. |
| 2011/0102706 A1* | 5/2011 | Oshio ............................ 349/61 |
| 2011/0204389 A1 | 8/2011 | Kasakura et al. |
| 2012/0032208 A1 | 2/2012 | Brandes |
| 2012/0112626 A1 | 5/2012 | Sakuta et al. |
| 2012/0187862 A1 | 7/2012 | Britt et al. |
| 2012/0212123 A1 | 8/2012 | Sakuta et al. |
| 2012/0267999 A1 | 10/2012 | Sakuta et al. |
| 2012/0286646 A1 | 11/2012 | Sakuta et al. |
| 2012/0319565 A1 | 12/2012 | Sakuta et al. |
| 2013/0082289 A1 | 4/2013 | Sakuta et al. |

FOREIGN PATENT DOCUMENTS

| | | |
|---|---|---|
| JP | 2005-78905 A | 3/2005 |
| JP | 2006-299097 A | 11/2006 |
| JP | 2008-291203 A | 12/2008 |
| JP | 2008-544553 A | 12/2008 |
| JP | 2009-64999 A | 3/2009 |
| JP | 2009-123429 A | 6/2009 |
| WO | WO 2005/090517 A1 | 9/2005 |
| WO | WO 2008/001799 A1 | 1/2008 |
| WO | WO 2011/024818 A1 | 3/2011 |

OTHER PUBLICATIONS

U.S. Appl. No. 13/832,713, filed Mar. 15, 2013, Sakuta, et al.
U.S. Appl. No. 13/918,514, filed Jun. 14, 2013, Sakuta, et al.
U.S. Appl. No. 14/041,171, filed Sep. 30, 2013, Sakuta, et al.

* cited by examiner

| Excitation Light Ratio(%) | 0 | 10 | 20 | 30 | 40 | 50 | 60 | 70 | 80 | 90 | 100 | 110 | 120 | 130 |
|---|---|---|---|---|---|---|---|---|---|---|---|---|---|---|
| Ra | 92 | 91 | 89 | 88 | 87 | 86 | 85 | 85 | 85 | 85 | 85 | 85 | 85 | 85 |
| duv | 0.0000 | 0.0000 | 0.0000 | 0.0000 | 0.0000 | 0.0000 | -0.0005 | -0.0013 | -0.0023 | -0.0035 | -0.0047 | -0.0061 | -0.0071 | -0.0083 |
| Correlated Color Temperature (K) | 1900 | 1900 | 1900 | 1900 | 1900 | 1900 | 1900 | 1900 | 1900 | 1900 | 1900 | 1900 | 1900 | 1900 |

FIG. 4

| Excitation Light Ratio (%) | | 70 | 48 | 27 | 14 | 10 | 6 | 3 |
|---|---|---|---|---|---|---|---|---|
| Chip | | Peak Wavelength 410 nm | | | | | | |
| Sealing Material (%) | | 85.00 | 83.00 | 79.00 | 77.63 | 77.00 | 75.90 | 75.04 |
| Phosphor | Blue SBCA (%) | 0.00 | 1.20 | 3.00 | 5.01 | 6.20 | 7.10 | 8.00 |
| | Green β-SIALON (%) | 2.70 | 2.80 | 3.00 | 2.67 | 2.53 | 2.50 | 2.47 |
| | Red CASON (%) | 12.30 | 13.00 | 15.00 | 14.69 | 14.30 | 14.50 | 14.49 |
| Total (%) | | 100 | 100 | 100 | 100 | 100 | 100 | 100 |

FIG. 8

| | EMISSION EFFICIENCY $\eta_L$ (lm/W) | CHROMATICITY POINT | | CORRELATED COLOR TEMPERATURE CCT (K) |
|---|---|---|---|---|
| | | x | y | |
| EXCITATION LIGHT RATIO: 70% | 37.0 | 0.54 | 0.41 | 1899 |
| EXCITATION LIGHT RATIO: 48% | 40.4 | 0.54 | 0.41 | 1924 |
| EXCITATION LIGHT RATIO: 27% | 39.7 | 0.54 | 0.42 | 1928 |
| EXCITATION LIGHT RATIO: 14% | 37.2 | 0.54 | 0.41 | 1871 |
| EXCITATION LIGHT RATIO: 10% | 35.8 | 0.54 | 0.41 | 1880 |
| EXCITATION LIGHT RATIO: 6% | 34.2 | 0.54 | 0.41 | 1879 |
| EXCITATION LIGHT RATIO: 3% | 33.0 | 0.54 | 0.41 | 1880 |

| Ra | R01 | R02 | R03 | R04 | R05 | R06 | R07 | R08 | R09 | R10 | R11 | R12 | R13 | R14 | R15 |
|---|---|---|---|---|---|---|---|---|---|---|---|---|---|---|---|
| 80 | 80 | 87 | 89 | 77 | 75 | 79 | 86 | 67 | 33 | 67 | 72 | 45 | 80 | 92 | 78 |
| 83 | 82 | 89 | 91 | 81 | 79 | 83 | 88 | 70 | 38 | 72 | 77 | 58 | 83 | 93 | 79 |
| 86 | 86 | 92 | 93 | 85 | 84 | 89 | 89 | 74 | 46 | 78 | 83 | 72 | 87 | 94 | 82 |
| 90 | 90 | 96 | 96 | 89 | 90 | 97 | 88 | 75 | 52 | 89 | 90 | 91 | 92 | 98 | 85 |
| 92 | 92 | 97 | 99 | 91 | 92 | 98 | 88 | 77 | 55 | 92 | 93 | 95 | 93 | 98 | 87 |
| 93 | 93 | 98 | 99 | 93 | 94 | 97 | 89 | 78 | 58 | 95 | 96 | 96 | 95 | 99 | 88 |
| 93 | 95 | 98 | 99 | 95 | 96 | 96 | 89 | 80 | 61 | 97 | 98 | 93 | 96 | 99 | 89 |

COLOR RENDERING INDEX

| EXCITATION LIGHT RATIO (%) | | | 19 |
|---|---|---|---|
| CHIP | | | PEAK WAVELENGTH :409nm |
| SEALING MATERIAL (%) | | | 81.50 |
| PHOSPHOR | BLUE | SBCA(%) | 5.50 |
| | GREEN | β-SIALON(%) | 6.00 |
| | RED | SCASN(%) | 7.00 |
| TOTAL (%) | | | 100 |

FIG. 9

| EXCITATION LIGHT RATIO: 19% | EMISSION EFFICIENCY | CHROMATICITY POINT | | CORRELATED COLOR TEMPERATURE | COLOR RENDERING INDEX |
|---|---|---|---|---|---|
| | $\eta_L$ (lm/W) | x | y | CCT(K) | Ra |
| | 40.5 | 0.54 | 0.41 | 1885 | 82 |

FIG. 10

SEMICONDUCTOR LIGHT-EMITTING DEVICE, SEMICONDUCTOR LIGHT-EMITTING SYSTEM AND ILLUMINATION FIXTURE

CROSS-REFERENCE TO RELATED APPLICATION

This is a continuation of International Application PCT/JP2012/058398, filed on Mar. 29, 2012, and designated the U.S., (and claims priority from Japanese Patent Application 2011-124596 which was filed on Jun. 2, 2011 and Japanese Patent Application 2012-045422 which was filed on Mar. 1, 2012,) the entire contents of which are incorporated herein by reference.

TECHNICAL FIELD

The present invention relates to a semiconductor light-emitting device, a semiconductor light-emitting system provided with the semiconductor light-emitting device, and an illumination fixture provided with the semiconductor light-emitting device, and more particularly to a semiconductor light-emitting device emitting light with a correlated color temperature equal to or higher than 1600 K and lower than 2400 K, a semiconductor light-emitting system provided with the semiconductor light-emitting device, and an illumination fixture provided with the semiconductor light-emitting device.

BACKGROUND ART

Incandescent electric lamps and fluorescent lamps are widely used as light sources for illumination devices. In addition to these lamps, illumination devices using a semiconductor light-emitting element such as a LED or an organic EL (OLED) as a light source have been developed and used in recent years. Since a variety of emission colors can be obtained with those semiconductor light-emitting elements, the development and use of illumination devices in which a plurality of semiconductor light-emitting elements with different emission colors are combined and the emission colors thereof are combined to obtain the radiated light of the desired color have been started.

Patent Document 1 describes an example of a semiconductor light-emitting device that uses a violet light-emitting diode element and emits light with a correlated color temperature equal to or higher than about 2700 K and equal to or lower than 4000 K and a general color rendering index Ra (referred to hereinbelow simply as Ra) equal to or greater than 80.

Patent Document 2 describes a pseudo-flame type light-emitting device that has a core section with an external shape resembling a candle flame, an inner flame section, and an outer section. The color temperature of the outer flame section of the device described in Patent Document 2 is 1000 K to 2200 K. It is also indicated that in order to obtain the color temperature of the outer flame section within a range from 1000 K to 2200 K, the device described in Patent Document 2 is provided with a light-emitting element emitting blue light in the core section and also provided with a phosphor (more specifically, an YAG (Yttrium Aluminum Garnet) phosphor) emitting yellow to yellow-red light in the outer flame section.

Patent Document 3 describes an illumination device with an outer shape resembling a candle and candle flame that emits light with a correlated color temperature of about 1500 K. The illumination device described in Patent Document 3 includes a light source module constituted by two light-emitting elements. Each of the two light-emitting elements has a plurality of light-emitting unit layers emitting monochromatic light rays of different wavelengths, and the emission intensity at each wavelength corresponding to the number and thickness of the light-emitting unit layers is adjusted to bring the distribution of the light emission spectrum to that of the solar light spectrum and increase the Ra.

Patent Document 4 describes a light-emitting device provided with a blue LED with a peak wavelength of 470 nm to 480 nm and a fluorescent substance with a peak wavelength of 600±3 nm and emitting light with a color temperature of 1900 K to 2100 K.

Patent Document 5 describes a light source provided with a blue GaN (Gallium Nitride) LED, a red quantum dot substance, and a yellow-green phosphor substance and emitting light with a color temperature of 1000 K to 16000 K. Patent Document 5 indicates that a color rendering index (CRI) can be set to a desired value by selecting the type and configuration of the LED, quantum dot substance, and phosphor substance.

Patent Document 6 describes a LED illumination lighting fixture in which three blue LED with a peak wavelength of about 480 nm are used as a light emission source, and phosphors coated on each of the blue LED emit respective fluorescence. In the LED illumination lighting fixture described in Patent Document 6, a mixture of a green phosphor and a red phosphor is coated on two blue LED from among the three blue LED, and a yellow phosphor is coated on the remaining one blue LED. The LED illumination lighting fixture described in Patent Document 6 radiates a combination light of the blue light emitted by each blue LED and fluorescence emitted by each phosphor.

Patent Document 7 describes an illumination device provided with a violet LED, and a light-emitting body obtained by mixing a blue phosphor, a green phosphor, and a red phosphor, each emitting fluorescence obtained by wavelength conversion of part of the light emitted by the violet LED. The illumination device described in Patent Document 7 radiates combination light of the light emitted by the violet LED and the fluorescence emitted by the light-emitting body.

Patent Document 1: WO 2011/024818
Patent Document 2: Japanese Patent Application Publication No. 2005-78905
Patent Document 3: Japanese Patent Application Publication No. 2004-128443
Patent Document 4: Japanese Patent Application Publication No. 2009-64999
Patent Document 5: Japanese Translation of PCT Application No. 2008-544553
Patent Document 6: Japanese Patent Application Publication No. 2009-123429
Patent Document 7: WO 2008/001799

When a semiconductor light-emitting device using a semiconductor light-emitting element such as a LED as a light source is used as an illumination device for indoor illumination such as indirect illumination, candle color light should be emitted at a high value of Ra (more specifically, light with a correlated color temperature equal to or higher than 1600 K and lower than 2400 K, preferably lower than 2000 K).

However, Patent Document 1 does not describe a device that emits light with a correlated color temperature equal to or higher than 1600 K and lower than 2400 K.

Further, Patent Document 2 and Patent Document 4 do not describe a configuration for increasing the Ra, or a research aimed at the development of such a configuration.

In the illumination device described in Patent Document 3, light emitted only by a special light-emitting element is radiated. The resultant problem is that a circuit for controlling the output of the light-emitting element is necessary and the cost of production and the like increases. Another problem is that color separation easily occurs due to a strong directionality of the light emitted by the aforementioned light-emitting element.

Patent Document 5 does not describe a configuration for increasing the Ra in a device emitting light with a correlated color temperature equal to or higher than 1600 K and lower than 2400 K, or a research aimed at the development of such a configuration.

The LED illumination lighting fixture described in Patent Document 6 uses blue LED that emits light with a wavelength longer than that of a violet LED as a light emission source. The resultant problem is that the emission efficiency is low. Further, since a mixture of phosphors is coated on a single blue LED so as to emit light including a large number of red components, the candle color light with a sufficiently high Ra cannot be emitted.

In the light-emitting device described in Patent Document 7, color rendering capacity in a red region is increased, but a method for further increasing the color rendering capacity of the candle color light, which is the light with a lower correlated color temperature, is not described.

With the techniques described in Patent Documents 1 to 7, the visual feeling created by the light sources is inadequate when compared with the natural candle, and the emitted light seems unnatural for the candle color, for example, because of bluish coloration.

DISCLOSURE OF THE INVENTION

The present invention resolves the above-described problems, and it is an object of the present invention to provide a semiconductor light-emitting device that emits the light with a correlated color temperature equal to or higher 1600 K and lower than 2400 K, preferably lower than 2000 K, and with a high Ra, that is, the light that excels in color rendering capacity, a semiconductor light-emitting system provided with the semiconductor light-emitting device, and an illumination fixture provided with the semiconductor light-emitting device.

To attain the abovementioned object, the present invention provides a semiconductor light-emitting device including: a semiconductor light-emitting element and a phosphor that emits light using the semiconductor light-emitting element as an excitation source, the semiconductor light-emitting device emitting light with a correlated color temperature equal to or higher than 1600 K and lower than 2400 K, preferably lower than 2000 K, wherein the phosphor includes at least a green phosphor and a red phosphor, and in a spectrum of light emitted from the semiconductor light-emitting device, a value of a peak intensity of the light emitted by the semiconductor light-emitting element is less than 60% of the maximum peak intensity of the light emitted by the phosphor.

It is preferred that a violet light-emitting diode element be used as the semiconductor light-emitting element, and it is also preferred that a semiconductor light-emitting element radiating the light having an emission peak at equal to or greater than 380 nm and equal to or less than 430 nm be used. When a violet light-emitting diode element, or a semiconductor light-emitting element radiating the light having an emission peak at equal to or greater than 380 nm and equal to or less than 430 nm is used, the semiconductor light-emitting device preferably includes a blue phosphor, a green phosphor, and a red phosphor.

Further, it is preferred that the value of the peak intensity of the light emitted by the semiconductor light-emitting element of the semiconductor light-emitting device be less than 60% of the maximum peak intensity of the light emitted by the phosphor, and the maximum peak be at a position equal to or greater than 600 nm and equal to or less than 660 nm.

With the semiconductor light-emitting device of such a configuration, the light can be emitted that has a correlated color temperature equal to or higher than 1600 K, preferably equal to or higher than 1700 K, and lower than 2400 K, preferably lower than 2000 K, and has a high Ra.

The semiconductor light-emitting device is preferably configured to emit light with a spectrum such that the value of the peak intensity of the light emitted by the light-emitting element is equal to or greater than 5% of the maximum peak intensity of the light emitted by the phosphor. With such a configuration, it is possible to obtain a high value of Ra and also a high value of emission efficiency.

The blue phosphor may be configured to have a half-width of emission peak wavelength of equal to or greater than 30 nm. The blue phosphor may be $(Sr,Ba,Ca)_5(PO_4)_3Cl:Eu$ or $BaMgAl_{10}O_{17}:Eu$.

The semiconductor light-emitting device may be configured such that a chromaticity coordinate of the light emitted by the semiconductor light-emitting device has a deviation duv from a black body radiation trajectory curve of equal to or greater than −0.02 and equal to or less than 0.02 in a XY chromaticity diagram of a CIE (1931) XYZ color system.

The green phosphor may be β-Sialon, $(Ba,Sr)_3Si_6O_{12}N_2:Eu$, or $(Sr,Ba)_2SiO_4:Eu$, and the red phosphor may include $(CaAlSiN_3)_{1-x}(Si_2N_2O)_x:Eu$ (x satisfies the condition 0<x<0.5).

The red phosphor may include $K_2SiF_6:Mn$ and may include $A_{2+x}M_yMn_zF_n$ (where A is either or both of Na and K, M is Si and Al, and the following conditions are satisfied: $-1 \le x \le 1$; $0.9 \le y+z \le 1.1$, $0.001 \le z \le 0.4$, and $5 \le n \le 7$).

The phosphor may be configured to transmit the light emitted by the semiconductor light-emitting element with a predetermined transmittance and radiate the transmitted light to the outside of the light-emitting device.

The semiconductor light-emitting device may further include a holding member that holds the phosphor, wherein the holding member is configured such that the phosphor of each color is held in a predetermined region that is set for each color, and a phosphor layer is formed in which the regions where the phosphors are held for the respective colors are arranged, and the phosphor layer is supported at a distance equal to or greater than 0.1 mm and equal to or less than 500 mm from the semiconductor light-emitting element. With such a configuration, cascade excitation occurring when phosphors of each color are mixed can be prevented.

The semiconductor light-emitting system in accordance with the present invention includes any of the semiconductor light-emitting devices having the above-described features as a first semiconductor light-emitting device, and a semiconductor light-emitting device that emits light with a correlated color temperature different from that of the light emitted by the first semiconductor light-emitting device, as a second semiconductor light-emitting device.

With such a configuration, the correlated color temperature of the light emitted by the semiconductor light-emitting system can be adjusted between the correlated color temperature of the light emitted by the first semiconductor light-emitting device and the correlated color temperature of the light emitted by the second semiconductor light-emitting device.

A value of a general color rendering index Ra of the first semiconductor light-emitting device may be equal to or greater than 86, and a value of a general color rendering index Ra of the second semiconductor light-emitting device may be equal to or greater than 86. With such a configuration, fluctuations of the general color rendering index Ra during the adjustment of the color temperature in the semiconductor light-emitting system can be reduced.

The illumination fixture in accordance with the present invention is provided with any of the semiconductor light-emitting devices having the above-described features.

With the semiconductor light-emitting device in accordance with the present invention, it is possible to emit light with a correlated color temperature equal to or higher than 1600 K and lower than 2400 K, preferably lower than 2000 K, and with a high value of Ra, that is, the light excellent in color rendering capacity, this light having no bluish coloration and felt as having a natural candle color. Furthermore, it is possible to adjust the ratio of the maximum peak intensity of the light emitted by the phosphor and the value of the peak intensity of the light emitted by the semiconductor light-emitting element and increase the value of Ra, without performing a complex adjustment of the mixing ratio of phosphors such as a green phosphor and a red phosphor or selecting the phosphors with the only object of increasing the Ra.

BRIEF DESCRIPTION OF THE DRAWINGS

FIG. 4 is a table illustrating the simulation results relating to the Ra corresponding to variations in the excitation light ratio.

FIG. 8 is a table illustrating changes in optical characteristics corresponding to changes in the excitation light ratio, the table being obtained by using the test samples shown in FIG. 6.

FIG. 9 is a table illustrating the ratio of phosphors of each color and a sealing material in the other test sample.

FIG. 10 is a table illustrating the optical characteristics of the other test sample shown in FIG. 9.

FIG. 11-B shows a schematic perspective view illustrating a configuration of a semiconductor light-emitting device.

BEST MODE FOR CARRYING OUT THE INVENTION

The embodiments of the present invention will be explained below with reference to the appended drawings. The present invention is not limited to the contents described hereinbelow and can be changed in any manner, without departing from the scope and essence thereof. The drawings used in the explanation of the present embodiment all illustrate schematically the properties of the semiconductor light-emitting device 1 in accordance with the present invention and can be partially enhanced, enlarged, reduced, or omitted, as necessary, to deepen the understanding. Further, various numerical values used herein are all illustrative and can be variously changed, as necessary.

Figure 1:
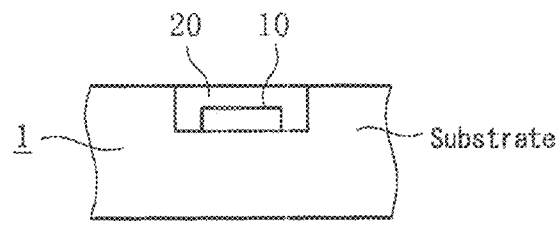
FIG. 1 is a schematic explanatory drawing illustrating a configuration example of the semiconductor light-emitting device in accordance with the present invention.

FIG. 1 is a schematic explanatory drawing illustrating a configuration example of the semiconductor light-emitting device 1 in the embodiment of the present invention. As shown in FIG. 1, the semiconductor light-emitting device 1 in the embodiment of the present invention includes a LED chip 10 that is a semiconductor light-emitting element and a phosphor 20 that converts the wavelength of the light emitted by the LED chip 10. The device emits the combination light with a correlated color temperature equal to or higher than 1600 K and lower than 2400, preferably lower than 2000 K.

A blue light-emitting diode element or a violet light-emitting diode element can be used as the LED chip 10. When a blue light-emitting diode element is used as the LED chip 10, the phosphor 20 differs from that used when the violet light-emitting diode element is used. It is more preferred that a violet light-emitting diode element be used as the LED chip 10.

(Combination of LED Chip 10 and Phosphor 20)

When the LED chip 10 is a blue light-emitting diode element, the phosphor 20 includes at least a green phosphor and a red phosphor. The light emitted in this case is usually combination light including as components thereof part of the blue light emitted from the LED chip 10, which is the blue light-emitting diode element, green light obtained by wavelength conversion of another part of the blue light by the green phosphor, and red light obtained by wavelength conversion of yet another part of the blue light by the red phosphor, and this combination light has a correlated color temperature equal to or higher than 1600 K and lower than 2400 K, preferably lower than 2000 K. The emission peak wavelength of blue light-emitting diode elements is typically 440 nm to 470 nm. The phosphor 20 may also include a yellow phosphor that emits yellow light obtained by wavelength conversion of part of the blue light emitted from the blue light-emitting diode element.

When the LED chip 10 is a violet light-emitting diode element, the phosphor 20 includes a green phosphor, a red phosphor, and a blue phosphor. The light emitted in this case is usually combination light including as components thereof ultraviolet light or violet light emitted from the LED chip 10, which is the violet light-emitting diode element, blue light obtained by wavelength conversion by the blue phosphor of part of the ultraviolet light or violet light emitted from the LED chip 10, which is the violet light-emitting diode element, green light obtained by wavelength conversion by the green phosphor of another part of the ultraviolet light or violet light, and red light obtained by wavelength conversion by the red phosphor of yet another part of the ultraviolet light or violet light, and this combination light has a correlated color temperature equal to or higher than 1600 K and lower than 2400 K, preferably lower than 2000 K.

In the present embodiment, the Ra is increased by configuring the LED chip 10 and the phosphor 20 such that the ratio of the peak intensity of the light (also referred to hereinbelow as excitation light) emitted by the LED chip 10 and the maximum peak intensity of the light (also referred to hereinbelow as fluorescence) emitted by the phosphor 20 excited by the excitation light in the emission spectrum of the combination light that has a correlated color temperature equal to or higher than 1600 K and lower than 2400 K, preferably lower than 2000 K, is within a predetermined range. The percentage of the ratio of the peak intensity of the excitation light to the maximum peak intensity of the fluorescence is called excitation light ratio.

The reason why the Ra of the combination light emitted by the semiconductor light-emitting device 1 can be increased by adjusting the excitation light ratio in the present embodiment is explained below. Where the correlated color temperature of the combination light emitted by a white light source is decreased, the light emitted by the white light source becomes red and the ratio of the spectrum of a short wavelength region (for example, a region with a wavelength equal to or less than 450 nm) in the emission spectrum decreases. This can be explained by comparing the ratio of the spectrum with wavelengths equal to or less than 450 nm in the spectrum of light with a correlated color temperature of 2700 K and the ratio of the spectrum with wavelengths equal to or less than 450 nm in the spectrum of light with a correlated color temperature of 1900 K. The light with a correlated color temperature of 2700 K is, for example, light emitted by an incandescent lamp used for illumination (can be also referred to hereinbelow as incandescent color light). The light with a correlated color temperature of 1900 K is, for example, light emitted by candle flame (can be referred to hereinbelow as candle color light).

[Formula 1]

$$u(\lambda, T) = \frac{8\pi hc}{\lambda^5} \frac{1}{e^{\frac{hc}{\lambda kT}} - 1} \quad (1)$$

In Eq. (1) above,
λ: wavelength (m),
T: color temperature (K),
k: Boltzmann constant (J·K$^{-1}$),
h: Planck constant (J·s),
c: light speed (m/s).

Where the ratio of the integral value of the spectrum with wavelengths equal to or less than 450 nm in the integral value of the spectrum in the visible light region is calculated by using Eq. (1) above, the ratio of the integral value of the spectrum with wavelengths equal to or less than 450 nm of the light with a correlated color temperature of 2700 K is 2.5% and the ratio of the integral value of the spectrum with wavelengths equal to or less than 450 nm of the light with a correlated color temperature of 1900 K is 0.4%. In other words, the ratio of the integral value of the spectrum with wavelengths equal to or less than 450 nm of the light with a correlated color temperature of 1900 K is equal to or less than ⅙ of the ratio of the integral value of the spectrum with wavelengths equal to or less than 450 nm of the light with a correlated color temperature of 2700 K, and the ratio of the spectrum of the light with a short wavelength such as equal to or less than 450 nm in the candle color light is lower than that of the incandescent color light.

Therefore, when a white lamp is produced by using a blue light-emitting diode element or a violet light-emitting diode element as an excitation source, where the excitation intensity (intensity of light emitted by the excitation source) of the incandescent color combination light and candle color combination light is the same, the ratio of the spectrum of the excitation light in the spectrum with wavelengths equal to or less than 450 nm is higher in the candle color combination light than in the incandescent color combination light. In other words, the effect produced by the excitation light on the correlated color temperature in the candle color combination light is stronger than the effect produced by the excitation light on the correlated color temperature in the incandescent color combination light. Therefore, the adjustment of the excitation light is more important in the candle color combination light.

For example, when a violet light-emitting diode element and a red phosphor, a green phosphor, and a blue phosphor are used as the light source for emitting candle color combination light, in order to adjust the correlated color temperature of the emitted combination light to the correlated color temperature of the candle color combination light, it is necessary to reduce the compounded amount of the blue phosphor, which emits short-wavelength light, with respect to that in the case of the incandescent color. However, where such a reduction is made, the spectral intensity of the blue region generated by the fluorescence in the white color spectrum of the light source decreases by comparison with that in the black body radiation spectrum serving as a reference for the color rendering capacity. Further, since the spectrum of the excitation light with a narrow bandwidth that has been emitted by a violet light-emitting diode element remains, regardless of the decrease in the spectral intensity of fluorescence in the blue region, the color rendering capacity decreases. In other words, the Ra decreases and light with high color rendering capacity cannot be emitted.

Therefore, when the candle color combination light with a correlated color temperature equal to or higher than 1600 K and lower than 2400 K, preferably lower than 2000 K, is emitted, it is difficult to increase the Ra by adjusting the mixing ratio of the red phosphor, green phosphor, and blue phosphor or by selecting the phosphors, which is the method that can be used when the daylight color combination light with a correlated color temperature of about 6500 K is emitted or when the incandescent color combination light with a correlated color temperature of about 2700 K is emitted. Therefore, in the present embodiment, the Ra is increased by adjusting the excitation light ratio.

Specific examples of the above-mentioned phosphors are described below. The phosphors listed hereinbelow exemplify the advantageous phosphors in the present embodiment, but the phosphors that can be used are not limited thereto and phosphors of various types can be used without departing from the scope of the present invention.

(Green Phosphors)

The emission peak wavelength of green phosphors is usually equal to or greater than 500 nm, preferably equal to or greater than 510 nm, more preferably equal to or greater than 515 nm, and green phosphors with an emission peak wavelength within a range less than 550 nm, preferably equal to or less than 542 nm are usually preferred. The preferred examples of such green phosphors include: $(Y,Lu)_3(Al,$ Ga)$_5$O$_{12}$:Ce, CaSc$_2$O$_4$:Ce, Ca$_3$(Sc,Mg)$_2$Si$_3$O$_{12}$:Ce, (Sr,Ba)$_2$SiO$_4$:Eu (BSS), (Si,Al)$_6$(O,N)$_8$:Eu (β-Sialon), (Ba,Sr)$_3$Si$_6$O$_{12}$N$_2$:Eu (BSON), SrGa$_2$S$_4$:Eu, and BaMgAl$_{10}$O$_{17}$:Eu, Mn. The half-width of the emission peak wavelength of the green phosphor is preferably equal to or greater than 50 nm, more preferably equal to or greater than 65 nm. Where a phosphor with a broad emission peak is used as the green phosphor, the color rendering capacity tends to improve over that obtained in the case where a phosphor with a narrow half-width is used as the blue phosphor.

(Red Phosphor)

The emission peak wavelength of red phosphors is usually equal to or greater than 570 nm, preferably equal to or greater than 580 nm, more preferably equal to or greater than 585 nm, and red phosphors with an emission peak wavelength within a range equal to or less than 780 nm, preferably equal to or less than 700 nm, more preferably equal to or less than 680 nm are usually preferred. The preferred examples of such red phosphors include: CaAlSiN$_3$:Eu, CaAlSi(N,O)$_3$:Eu (can be also referred to hereinbelow as "CASON". Sometimes described as (CaAlSiN$_3$)$_{1-x}$(Si$_2$N$_2$O)$_x$:Eu (x satisfies the condition 0<x<0.5)), and (Ca,Sr)AlSiN$_3$:Eu (can be also referred to hereinbelow as "SCASN". Sometimes described as (Ca,Sr,Ba)AlSi(N,O)$_3$:Eu)), (Ca,Sr,Ba)$_2$Si$_5$(N,O)$_8$:Eu, (Ca,Sr,Ba)Si(N,O)$_2$:Eu, (Ca,Sr,Ba)AlSi(N,O)$_3$:Eu, (Sr,Ba)$_3$SiO$_5$:Eu, (Ca,Sr)S:Eu, SrAlSi$_4$N$_7$:Eu, (La,Y)$_2$O$_2$S:Eu, β-diketone Eu complexes such as Eu (dibenzoylmethane)$_3$·1,10-phenanthroline complex, carboxylic acid Eu complexes, K$_2$SiF$_6$:Mn, and Mn-activated germanates. Among them, (Ca,Sr,Ba)$_2$Si$_5$(N,O)$_8$:Eu, (Sr, Ca)AlSi(N,O)$_3$:Eu, SrAlSi$_4$N$_7$:Eu, (La,Y)$_2$O$_2$S:Eu, K$_2$SiF$_6$:Mn (part of Si may be substituted with Al or Na), and Mn-activated germinates are more preferred.

(Blue Phosphors)

The emission peak wavelength of blue phosphors is usually equal to or greater than 420 nm, preferably equal to or greater than 430 nm, more preferably equal to or greater than 440 nm, and blue phosphors with an emission peak wavelength within a range less than 500 nm, preferably equal to or less than 490 nm, more preferably equal to or less than 480 nm, still more preferably equal to or less than 470 nm, and even more preferably equal to or less than 460 nm are usually preferred. The preferred examples of such blue phosphors include: (Ca,Sr,Ba)MgAl$_{10}$O$_{17}$:Eu, (Sr, Ca,Ba,Mg)$_{10}$(PO$_4$)$_6$(Cl,F)$_2$:Eu, (Ba,Ca,Mg,Sr)$_2$SiO$_4$:Eu, (Ba, Ca,Sr)$_3$MgSi$_2$O$_8$:Eu, the preferred among them are (Ba,Sr)MgAl$_{10}$O$_{17}$:Eu, (Ca,Sr,Ba)$_{10}$(PO$_4$)$_6$(Cl,F)$_2$:Eu, and Ba$_3$MgSi$_2$O$_8$:Eu, the more preferred are Sr$_{10}$(PO$_4$)$_6$Cl$_2$:Eu, BaMgAl$_{10}$O$_{17}$:Eu, and the particularly preferred are (Sr$_{1-x}$Ba$_x$)$_5$(PO$_4$)$_3$Cl:Eu (x>0). The half-width of the emission peak wavelength of the blue phosphor is preferably equal to or greater than 30 nm, more preferably equal to or greater than 40 nm, even more preferably equal to or greater than 50 nm, and particularly preferably equal to or greater than 60 nm.

(Yellow Phosphors)

The emission peak wavelength of yellow phosphors is usually equal to or greater than 530 nm, preferably equal to or greater than 540 nm, and more preferably equal to or greater than 550 nm, and yellow phosphors with an emission peak wavelength within a range equal to or less than 620 nm, preferably equal to or less than 600 nm, and more preferably equal to or less than 580 nm are usually preferred. The preferred examples of such yellow phosphors include: Y$_3$Al$_5$O$_{12}$:Ce, (Y,Gd)$_3$Al$_5$O$_{12}$:Ce, (Sr, Ca,Ba,Mg)$_2$SiO$_4$:Eu, (Ca,Sr)Si$_2$N$_2$O$_2$:Eu, α-Sialon, and La$_3$Si$_6$N$_{11}$:Ce (part thereof may be substituted with Ca or O).

The phosphor 20 may be in the form of a powder or a light-emitting ceramic including a phosphor phase in a ceramic structure. In the case of a powder phosphor, it is preferred that the phosphor particles be disposed and immobilized in a transparent fixed matrix constituted by a polymer material or glass, or that the phosphor particles be deposited and immobilized in the form of a layer by electrodeposition or some other method on the surface of an appropriate member. When the light (more specifically, excitation light) emitted by the LED chip 10 is radiated to the outside of the semiconductor light-emitting device 1, the phosphor 20 transmits this light at a predetermined transmittance. Therefore, the excitation light ratio can be also called excitation light transmittance.

By combining, as appropriate, the above-described phosphors, it is possible to adjust the wavelength and intensity of the maximum peak in the spectrum of the light emitted by the light-emitting device 1. The wavelength and intensity of the maximum peak in the spectrum of the light emitted by the light-emitting device 1 in accordance with the present invention are not particularly limited, provided that the specific excitation light ratio in accordance with the present invention is satisfied, but where the wavelength of the maximum peak in the spectrum for light emitted by the light-emitting device 1 is equal to or greater than 600 nm and equal to or less than 660 nm, the so-called candle color combination light can be easily achieved. It is preferred that the maximum peak wavelength be equal to or greater than 610 nm and equal to or less than 660 nm.

(LED Chip 10)

It is preferred that a semiconductor light emitting element that emits light with a wavelength of 360 nm to 490 nm be used as the LED chip 10. For example, a blue light-emitting diode element and a violet light-emitting diode element can be used as such semiconductor light-emitting element. The semiconductor light emitting element is preferably a light-emitting diode element having a light-emitting section of a pn junction type that is formed by a gallium nitride, zinc oxide or silicon carbide semiconductor.

The LED chip 10 is preferably configured to have an emission peak wavelength of 380 nm to 420 nm. The reason why it is preferred that the emission peak wavelength of the LED chip 10 be equal to or greater than 380 nm is that where the difference between the excitation wavelength (wavelength of the excitation light) of the phosphor 20 and the phosphor emission wavelength is large, the energy loss caused by the Stokes shift increases and the emission efficiency of the semiconductor light-emitting device 1 (more specifically, the phosphor 20) decreases. In the case where no visible light (light with a wavelength of 380 nm to 780 nm) is included in the light emitted by the LED chip 10, the light emitted by the LED chip 10 produces no direct effect on the correlated color temperature or chromaticity of the light emitted by the semiconductor light-emitting device 1 and therefore the Ra does not change even if the excitation light ratio is changed.

The reason why it is preferred that the emission peak wavelength of the LED chip 10 be equal to or less than 420 nm is that the light emitted by the LED chip 10 (for example, a blue light-emitting diode element) in which a wavelength larger than 420 nm is taken as the emission peak wavelength includes a large number of blue components, and it is necessary to change significantly the compounding ratio of the green phosphor and red phosphor in order to adjust the excitation light ratio. When the LED chip 10 (for example, a violet light-emitting diode element) with an emission peak wavelength equal to or less than 420 nm is used, the excitation light ratio can be adjusted by adjusting the ratio of the total amount of the phosphor 20 and the amount of resin for sealing the phosphor 20 inside the semiconductor light-emitting device 1, without changing significantly the compounding ratio of the green phosphor, red phosphor, and blue phosphor.

In the case where a blue light-emitting diode element is used, when the emission peak wavelength changes, for example, due to heat generated by the blue light-emitting diode element, the chromaticity or color temperature of the light emitted by the semiconductor light-emitting device can change because of a large number of blue components included in the light emitted from the blue light-emitting diode element. By contrast, where a violet light-emitting diode element is used, even when the emission peak wavelength of the violet light-emitting diode element changes, variations in the chromaticity or color temperature of the light emitted by the semiconductor light-emitting device can be inhibited. Further, the emission peak wavelength of the semiconductor light emitting element can differ due to the difference between the production lots of semiconductor light emitting elements, but where a violet light-emitting diode element is used, even when the emission peak wavelength of the violet light-emitting diode element changes, variations in the chromaticity or color temperature of the light emitted by the semiconductor light-emitting device are small and therefore the semiconductor light-emitting devices can be produced with a high yield.

Furthermore, where a violet light-emitting diode element is used, variations in chromaticity occurring when the amount of electric current flowing in the element is changed are less than those in the case where a blue light-emitting diode element is used. Therefore, the violet light-emitting diode element can be advantageously used in the below-described semiconductor light-emitting system.

A method for changing the compounding ratio of the green phosphor, red phosphor, and blue phosphor, and a method for adjusting the ratio of the total amount of the phosphor 20 and the amount of resin for sealing the phosphor 20 inside the semiconductor light-emitting device 1, according to the LED chip 10, are described above as methods for adjusting the excitation light ratio in the combination light emitted by the semiconductor light-emitting device 1, but the excitation light ratio may be also adjusted by other methods. More specifically, for example, a filter (band-pass filter) that transmits the light with a wavelength other than the wavelength of the excitation light, a filter (UV cut filter) that does not transmit the light with a wavelength less than the wavelength of the excitation light, or a filter (band elimination filter) that does not transmit the light with the wavelength of the excitation light or transmits such light with a predetermined attenuation ratio may be disposed in the path by which the combination light emitted by the semiconductor light-emitting device 1 is radiated to the outside in the semiconductor light-emitting device 1, or in a transmission path of the excitation light.

<Test Samples>

Samples (semiconductor light-emitting device 1 of the present embodiment) for the test (including simulation) performed by the inventors of the present invention are described below. In the present test, a violet light-emitting diode element with an emission peak wavelength of 405 nm and a half-width of 30 nm is used as the LED chip 10. The emission peak wavelength and half-width are measured by using an integrating sphere. Further, β-Sialon is used as a green phosphor, CaAlSi(N,O)$_3$:Eu (CASON) is used as a red phosphor, and (Sr$_{1-x}$Ba$_x$)$_5$(PO$_4$)$_3$Cl:Eu (x>0) is used as a blue phosphor. The emission peak wavelength of the green phosphor is 540 nm and the half-width is 60 nm, the emission peak wavelength of the red phosphor is 640 nm and the half-width is 115 nm, and the emission peak wavelength of the blue phosphor is 475 nm and the half-width is 80 nm. The emission peak wavelength and half-width of each phosphor are measured by using a spectrophotometer.

Figure 2:
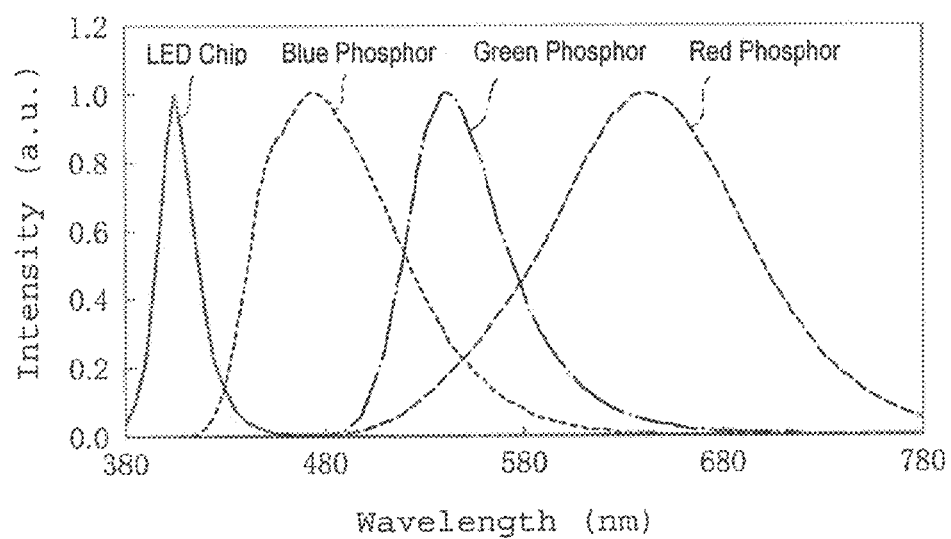
FIG. 2 is a graph illustrating emission spectra of a LED chip, a green phosphor, a red phosphor, and a blue phosphor.

FIG. 2 is a graph illustrating emission spectra of the LED chip 10, green phosphor, red phosphor, and blue phosphor. In FIG. 2, the emission spectrum of the LED chip 10 is shown by a solid line, the emission spectrum of the green phosphor is shown by a dot-dash line, the emission spectrum of the red phosphor is shown by a broken line, and the emission spectrum of the blue phosphor is shown by a dot line. As shown in FIG. 2, the emission peak wavelength of the LED chip 10 is 405 nm, the emission peak wavelength of the green phosphor is 540 nm, the emission peak wavelength of the red phosphor is 640 nm, and the emission peak wavelength of the blue phosphor is 475 nm.

The simulation was then performed such as to obtain the combination light with the desired correlated color temperature (more specifically, 1900 K) and the desired duv (more specifically, a value of the deviation duv of a chromaticity coordinate from a black body radiation trajectory curve of 0.0 to −0.0083, which is equal to or greater than −0.02 and equal to or less than 0.02, in a XY chromaticity diagram of a CIE (1931) XYZ color system) and to obtain the desired excitation light ratios (0% to 130% with a 10% interval), and the Ra was measured. More specifically, the simulation was used to obtain the emission spectrum for the semiconductor light-emitting device 1 in which the emission spectrum intensities of the LED chip 10 and the phosphors were adjusted to obtain the desired correlated color temperature, desired value of deviation duv, and desired excitation light ratio, and the Ra was measured. Thus, the simulation was used to obtain the emission spectrum of the semiconductor light-emitting device 1 that emits the combination light with a correlated color temperature of 1900 K and a duv of 0.0 to −0.0083, the semiconductor light-emitting device 1 demonstrating an excitation light ratio of 0%, 10%, 20%, 30%, 40%, 50%, 60%, 70%, 80%, 90%, 100%, 110%, 120%, and 130%, and the Ra was measured.

Figure 3:
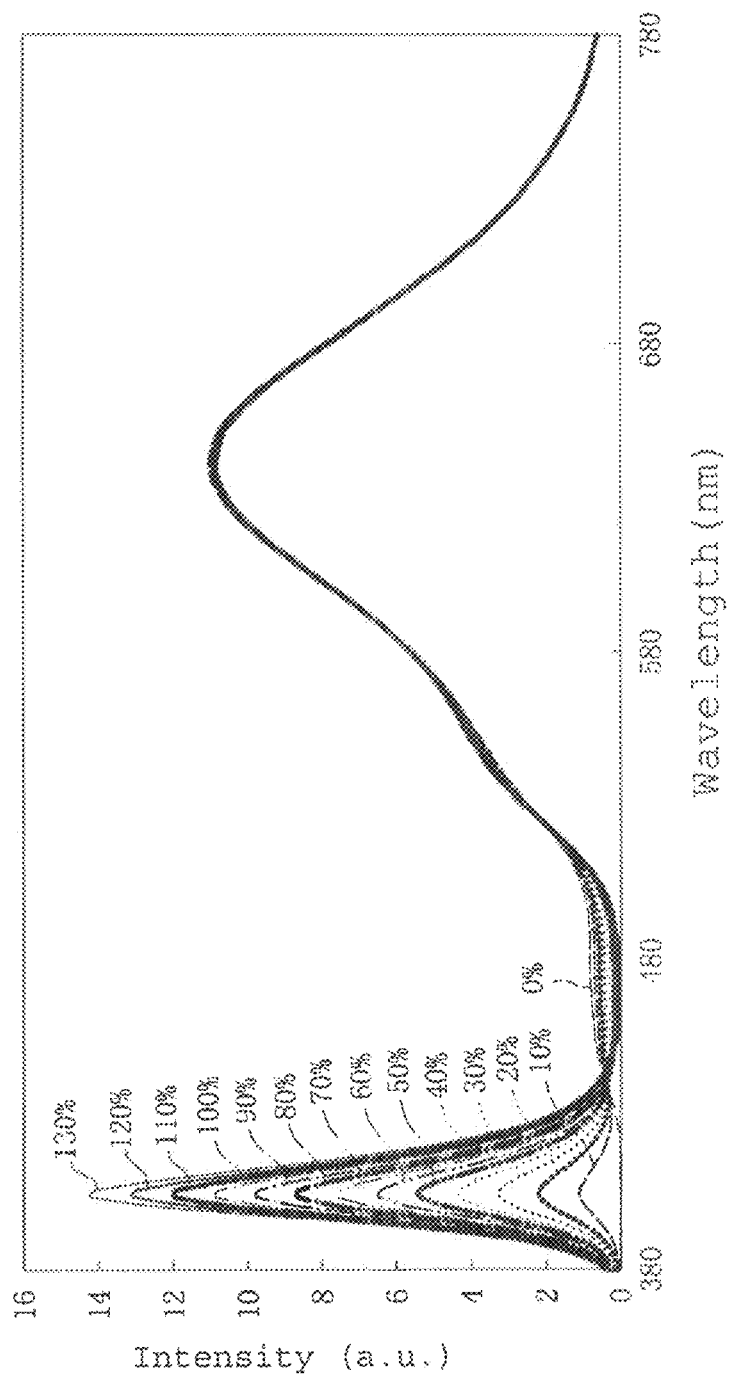
FIG. 3 is a graph illustrating the simulation results relating to the emission spectrum of the semiconductor light-emitting device using samples with different excitation light ratios.

FIG. 3 is a graph illustrating the simulation results relating to the emission spectrum of the semiconductor light-emitting device 1 using samples with different excitation light ratios. In FIG. 3, the emission spectrum of the semiconductor light-emitting device 1 using a sample with an excitation light ratio of 0% is shown by a fine broken line, the emission spectrum of the semiconductor light-emitting device 1 using a sample with an excitation light ratio of 10% is shown by a medium broken line, the emission spectrum of the semiconductor light-emitting device 1 using a sample with an excitation light ratio of 20% is shown by a thick dot line, the emission spectrum of the semiconductor light-emitting device 1 using a sample with an excitation light ratio of 30% is shown by a medium dot line, the emission spectrum of the semiconductor light-emitting device 1 using a sample with an excitation light ratio of 40% is shown by a fine dot line, the emission spectrum of the semiconductor light-emitting device 1 using a sample with an excitation light ratio of 50% is shown by a thick two-dot-dash line, the emission spectrum of the semiconductor light-emitting device 1 using a sample with an excitation light ratio of 60% is shown by a medium two-dot-dash line, the emission spectrum of the semiconductor light-emitting device 1 using a sample with an excitation light ratio of 70% is shown by a fine two-dot-dash line, the emission spectrum of the semiconductor light-emitting device 1 using a sample with an excitation light ratio of 80% is shown by a thick dot-dash line, the emission spectrum of the semiconductor light-emitting device 1 using a sample with an excitation light ratio of 90% is shown by a medium dot-dash line, the emission spectrum of the semiconductor light-emitting device 1 using a sample with an excitation light ratio of 100% is shown by a fine dot-dash line, the emission spectrum of the semiconductor light-emitting device 1 using a sample with an excitation light ratio of 110% is shown by a thick solid line, the emission spectrum of the semiconductor light-emitting device 1 using a sample with an excitation light ratio of 120% is shown by a medium solid line, and the emission spectrum of the semiconductor light-emitting device 1 using a sample with an excitation light ratio of 130% is shown by a fine solid line.

As described hereinabove, where the percentage of the ratio of the peak intensity of the excitation light to the peak intensity of fluorescence is an excitation light ratio, as shown in FIG. 3, the excitation light ratio changes more significantly due to significant changes in the value of the intensity of the emission spectrum with a wavelength close to 405 nm (that is, the peak intensity of the excitation light) than the changes in the emission spectrum with a wavelength close to 640 nm, which is the peak intensity of fluorescence. In other words, in the present embodiment, in the light emitted by the semiconductor light-emitting device 1, the excitation light ratio is changed by changing the intensity of the light (excitation light) emitted by the LED chip 10, which is a violet light-emitting diode element with an emission peak wavelength of 405 nm.

Figures 5, 6:
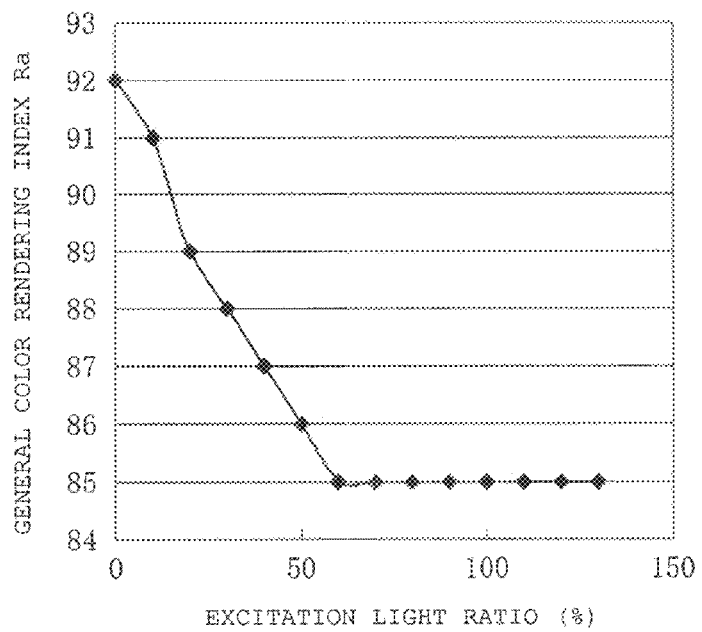
FIG. 5 is a graph illustrating the simulation results relating to the Ra corresponding to variations in the excitation light ratio.
FIG. 6 is a table illustrating the ratio of phosphors of each color and a sealing material in test samples that differ from each other in the excitation light ratio.

FIG. 4 is a table illustrating the simulation results relating to the Ra corresponding to variations in the excitation light ratio of the sample demonstrating the emission spectrum shown in FIG. 3. FIG. 5 is a graph illustrating the simulation results relating to the Ra corresponding to variations in the excitation light ratio of the sample demonstrating the emission spectrum shown in FIG. 3. As shown in FIG. 4 and FIG. 5, where the excitation light ratio decreases, the Ra increases. More specifically, the Ra value obtained when the excitation light ratio is equal to or greater than 60% is less than 86, but the Ra value obtained when the excitation light ratio is 50% is 86, the Ra value obtained when the excitation light ratio is 30% is 88, and the Ra value obtained when the excitation light ratio is 0% is 92. In the semiconductor light-emitting device 1 in accordance with the present invention, the value of the general color rendering index Ra is preferably equal to or greater than 86, more preferably equal to or greater than 88, still more preferably equal to or greater than 90, and particularly preferably equal to or greater than 92.

Further, as shown in FIG. 4, when the excitation light ratio is 0% to 50%, the duv can be made 0.0000 in the case where the correlated color temperature is made 1900 K, but when the excitation light ratio is 60% to 130%, the duv cannot not be made 0.0000 when the correlated color temperature is made 1900 K with the combination of the blue phosphor, green phosphor, and red phosphor used in the present investigation. Therefore, when the excitation light ratio is 60% to 130%, the Ra is measured by the simulation using the semiconductor light-emitting device 1 with the duv value which is negative and the closest to 0.

The inventors of the present invention fabricated a plurality of test samples with a correlated color temperature of about 1900 K and mutually different excitation light ratios by using the LED chip 10 and the phosphors similar to the phosphors of each color used in the above-descried simulation. Then, the correlated color temperature and color rendering indexes including special color rendering indexes such as R9 were measured for the semiconductor light-emitting device 1 using each of the prepared test samples, and the general color rendering index Ra and emission efficiency were calculated.

Figure 7:
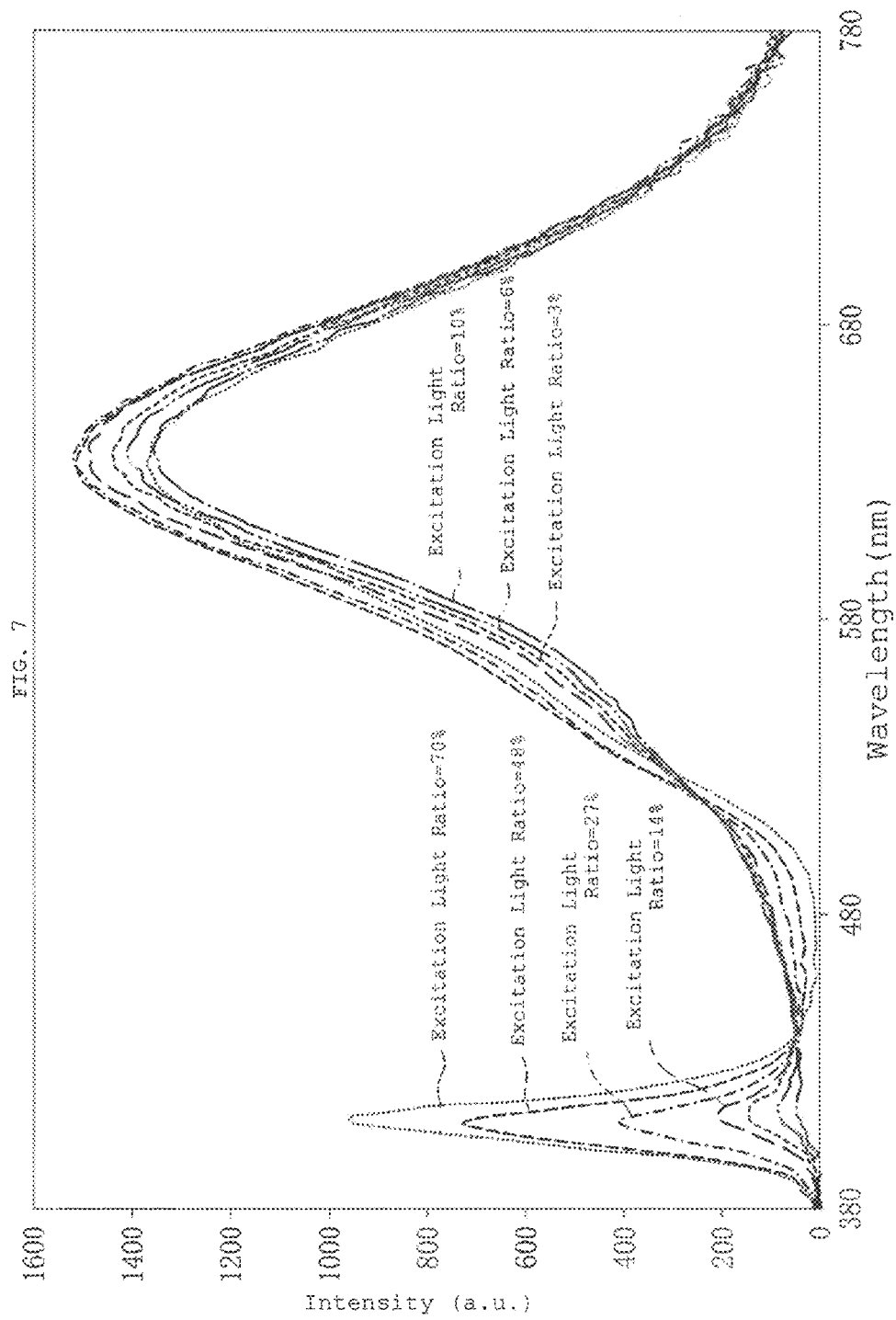
FIG. 7 is a graph illustrating the emission spectrum of the semiconductor light-emitting device using the test samples shown in FIG. 6 that differ from each other in the excitation light ratio.

FIG. 6 is a table illustrating the ratio of phosphors of each color and a sealing material in test samples that differ from each other in the excitation light ratio. FIG. 7 is a graph illustrating the emission spectrum of the semiconductor light-emitting device 1 using the same test samples that differ from each other in the excitation light ratio. In FIG. 7, the emission spectrum of the semiconductor light-emitting device 1 using the sample with an excitation light ratio of 70% is shown by a dot line, the emission spectrum of the semiconductor light-emitting device 1 using the sample with an excitation light ratio of 48% is shown by a broken line, the emission spectrum of the semiconductor light-emitting device 1 using the sample with an excitation light ratio of 27% is shown by a dot-dash line, the emission spectrum of the semiconductor light-emitting device 1 using the sample with an excitation light ratio of 14% is shown by a long-dash broken line, the emission spectrum of the semiconductor light-emitting device 1 using the sample with an excitation light ratio of 10% is shown by a long dot-dash line, the emission spectrum of the semiconductor light-emitting device 1 using the sample with an excitation light ratio of 6% is shown by a long two-dot-dash line, and the emission spectrum of the semiconductor light-emitting device 1 using the sample with an excitation light ratio of 3% is shown by a short-dash broken line.

FIG. 8 is a table illustrating changes in optical characteristics corresponding to changes in the excitation light ratio in the semiconductor light-emitting device 1 using the test samples shown in FIG. 6. As shown in FIG. 8, where the excitation light ratio decreases, the Ra value increases. When the excitation light ratio is 70%, the Ra value is 80, and when the excitation light ratio is 48%, the Ra value is 83. However, where the excitation light ratio is 27%, the Ra value is 86, where the excitation light ratio is 14%, the Ra value is 90, and where the excitation light ratio is 10%, the Ra value is 92. When the excitation light ratio further decreases and becomes 6% or 3%, the Ra is 93.

The special color rendering index R9 relating to the red color and the special color rendering index R12 relating to the blue color also tend to increase with the decrease in the excitation light ratio. R9 and R12 both have high values for the candle color light (in the present embodiment, the light with a correlated color temperature lower than 2400 K).

By contrast, the value of the emission efficiency $\eta_L$ peaks when the excitation light ratio is about 48% and tends to decrease when the excitation light ratio increases or decreases from this value as shown in FIG. 8. More specifically, the emission efficiency $\eta_L$ is 40.4 when the excitation light ratio is 48%, but the emission efficiency $\eta_L$ is 37.0 when the excitation light ratio is increased to 70%. In other words, the emission efficiency $\eta_L$ decreases when the excitation light ratio increases from 48%. Further, the emission efficiency $\eta_L$ also decreases as the excitation light ratio decreases from 48%, and the emission efficiency $\eta_L$ is 37.0 when the excitation light ratio is 3%. In other words, the emission efficiency $\eta_L$ decreases when the excitation light ratio decreases from 48%.

The inventors of the present invention also produced other test samples emitting light with a correlated color temperature about 1900 K by using a phosphor different from the red phosphor used in the above-described simulation, measured color rendering indexes including a special color rendering index such as R9 and the correlated color temperature, and calculated the general color rendering index Ra and the emission efficiency. More specifically, SCASN ((Sr, Ca)AlSi(N, O)$_3$:Eu) was used instead of CASON (CaAlSi(N,O)$_3$:Eu) as the red phosphor. FIG. 9 is a table illustrating the ratio of phosphors of each color and a sealing material in the other test sample. As shown in FIG. 9, the blue phosphor and green phosphor used in the other test sample are identical to the blue phosphor and green phosphor used in the aforementioned simulation and the aforementioned test samples. The peak wavelength of the LED chip used in the abovementioned other test sample is 409 nm which is about the same as the peak wavelength 410 nm of the LED chip 10 used in the aforementioned simulation and the aforementioned test samples.

FIG. 10 is a table illustrating the optical characteristics of the other test sample shown in FIG. 9. As shown in FIG. 10, the other test sample using SCASN as the red phosphor has an excitation light ratio of 19%, an emission efficiency $\eta_L$ of 40.5%, and a Ra of 82. As shown in FIG. 10, in the other test sample using SCASN as the red phosphor, when the excitation light ratio is 19%, the emission efficiency $\eta_L$ assumes a high value of 40.5%

As shown in FIG. 8 and FIG. 10, where the excitation light ratio is equal to or greater than 5% and less than 60%, the Ra value exceeds 80 and the emission efficiency $\eta_L$ exceeds 33% when the CASON or the SCASN is used as the red phosphor. In other words, where the excitation light ratio is equal to or greater than 5% and less than 60%, both the Ra value and the value of the emission efficiency $\eta_L$ are at a high level.

Where only the Ra value is considered, it is preferred that the excitation light ratio be equal to or less than 55%, more preferably equal to or less than 50%, especially preferably equal to or less than 45%, even more preferably equal to or less than 35%, still more preferably equal to or less than 25%, and most preferably equal to or less than 15%. The low limit value of the excitation light ratio is usually 0%.

Table 1 shows the results of a functional test performed by 13 people with respect to the light emitted by the semiconductor light-emitting device 1 using the test samples with difference excitation light ratio. In Table 1, the ⊗ column represents the number of people with the following response: "feels almost as the candle; close to the candle flame". The O column represents the number of people with the following response: "feels somewhat unnatural". The x column represents the number of people with the following response: "feels bluish and unnatural".

TABLE 1

| Excitation light ratio | ⊗ | ○ | x |
|---|---|---|---|
| 10% | 13 persons | 0 persons | 0 persons |
| 42% | 6 persons | 7 persons | 0 persons |
| 70% | 0 persons | 7 persons | 6 persons |

As shown in Table 1, the number of people with the response ⊗ increases and the number of people with the response x decreases with the decrease in the excitation light ratio. Therefore, the coordinate values of the chromaticity point and the correlated color temperature of the light ray emitted by each semiconductor light-emitting device 1 do not change that much, but in the present functional test, all of the persons being tested have decided that the light emitted by the test sample with a lower excitation light ratio is closer to the light emitted by a candle.

However, taking into account that where the excitation light ratio decreases to a value equal to or less than 48%, the emission efficiency $\eta_L$ also decreases, it is preferred that the excitation light ratio be less than 60% and equal to or greater than 5%, more preferably equal to or greater than 10%, and even more preferably equal to or greater than 20%.

It is also preferred that the maximum value of the spectrum with a wavelength equal to or greater than 440 nm and equal to or less than 480 nm be less than the maximum peak intensity of the light emitted by the LED chip 10. As shown in FIG. 6, in the present embodiment, the LED chip 10 is used which has a wavelength of the light with a maximum peak intensity of 410 nm. As shown in FIG. 7, the maximum value of the spectrum with a wavelength equal to or greater than 440 nm and equal to or less than 480 nm in the light emitted by a test sample with an excitation light ratio within a range equal to or greater than 5% and less than 60%, from among the test samples of the present embodiment, is less than the maximum peak intensity of the spectrum close to a wavelength of 410 nm, that is, the light emitted by the LED chip 10. With such a configuration it is possible to obtain a large Ra value and high emission efficiency at the same time, even in the case of light with a comparatively low correlated color temperature, such as lower than 2400 K.

According to the present embodiment, by decreasing the excitation light ratio (preferably to a value less than 60%), it is possible to emit the light with a correlated color temperature equal to or greater than 1600 K and lower than 2400 K, preferably lower than 2000 K, and a large Ra value. Further, the Ra value can be increased by adjusting the ratio of the value of the peak intensity of the light emitted by the LED chip 10 and the maximum peak intensity of the light emitted by the phosphor 20, without performing a complex adjustment of the mixing ratio of phosphors, such as a green phosphor and a red phosphor, or performing the selection of the phosphors with the object of only increasing the Ra.

When the LED chip 10 with an emission peak wavelength equal to or less than 420 nm is used, the excitation light ratio can be adjusted by adjusting the ratio of the total amount of the phosphor 20 and the amount of the silicone resin used as a sealing material for sealing the phosphor 20 inside the semiconductor light-emitting device 1 (that is, the ratio of the phosphor 20 in the silicone resin composition), without changing significantly the compounding ratio of the green phosphor, red phosphor, and blue phosphor.

In the above-described simulation and test samples, the phosphor 20 is formed by mixing the green phosphor, red phosphor, blue phosphor, and sealing material. However, a phosphor layer 20L in which the green phosphor, red phosphor, and blue phosphor are arranged side by side may be also formed at a position where the light emitted by the LED chip 10 is received. With such a configuration, the cascade excitation resulting from the fact that the phosphors of each color are mixed can be prevented.

Figure 11A:
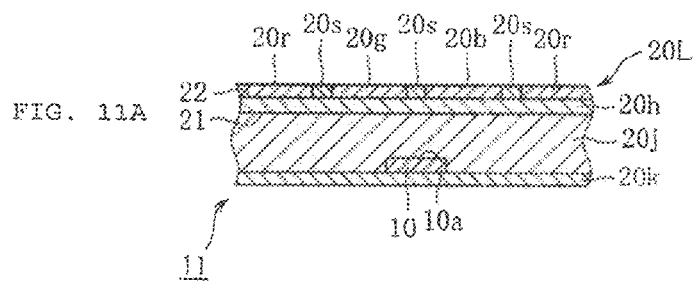
FIG. 11-A shows a schematic cross-sectional view illustrating a configuration of a semiconductor light-emitting device.
Figure 11B:
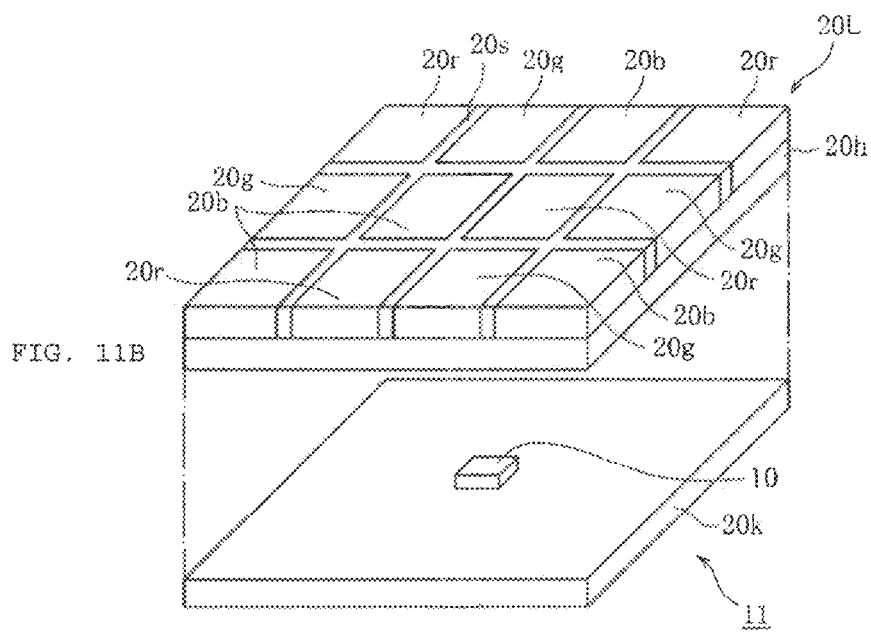

FIG. 11 is a schematic diagram illustrating the configuration of a semiconductor light-emitting device 11 where the phosphor layer 20L is formed. FIG. 11(a) is a schematic cross-sectional view illustrating the configuration of the semiconductor light-emitting device 11 where the phosphor layer 20L is formed. FIG. 11(b) is a schematic perspective view illustrating the configuration of the semiconductor light-emitting device 11 where the phosphor layer 20L is formed. As shown in FIGS. 11(a) and 11(b), the phosphor layer 20L includes a plurality of green phosphor sections 20g, red phosphor sections 20r, and blue phosphor sections 20b. The phosphor sections are formed on a holding member 20h formed in the form of a film or sheet so as to have a first surface 21 facing an upper surface 10a of the LED chip 10 mounted on a substrate 20k. In other words, the phosphor layer 20L includes the holding member 20h in which the phosphor sections are formed on a second surface 22.

For example, a transparent resin material or glass material is used for the holding member 20h. For example, a thermoplastic resin, a thermosetting resin, and a photocurable resin can be used as the transparent resin material, and it is preferred that a material be used that has sufficient transparency and durability with respect to the light emitted by the LED chip 10.

Examples of such materials include (meth)acrylic resins such as polymethyl (meth)acrylate, styrene resins such as polystyrene and styrene-acrylonitrile copolymer, polycarbonate resins, polyester resins, phenoxy resins, butyral resins, polyvinyl alcohol, cellulose resins such as ethyl cellulose, cellulose acetate, and cellulose acetate butyrate, epoxy resins, phenolic resins, and silicone resins. For example, an inorganic material prepared by solidifying a metal alkoxide, a ceramic precursor polymer, or a solution obtained by hydrolytic polymerization of a solution including a metal alkoxide by a sol-gel method, or combinations thereof, for example, an inorganic material having a siloxane bond or glass can be used as the aforementioned inorganic materials.

Further, partition sections 20s provided at the boundaries of the adjacent phosphor sections 20r, 20g, 20b of each color are formed on the holding member 20h in the phosphor layer 20L. In other words, a plurality of red phosphor sections 20r, a plurality of green phosphor sections 20g, and a plurality of blue phosphor sections 20b are provided side by side, with the partition sections 20s being interposed therebetween.

In the present embodiment, a plurality of red phosphor sections 20r, a plurality of green phosphor sections 20g, and a plurality of blue phosphor sections 20b are provided side by side, with the partition sections 20s being interposed therebetween, by coating by a screen printing method or the like the phosphor sections 20r, 20g, 20b of each color that are mixed with a predetermined filler on the regions partitioned by the partition sections 20s at one surface facing in the thickness direction of the holding member 20h (for example, the second surface 22 on the side opposite that of the first surface 21 that faces the upper surface 10a of the LED chip 10). In other words, a plurality of red phosphor sections 20r, a plurality of green phosphor sections 20g, and a plurality of blue phosphor sections 20b are arranged on the surface facing in the thickness direction of the film- or sheet-like phosphor layer 20L. The phosphor sections 20r, 20g, 20b of each color mixed with a predetermined filler may be also coated by screen printing or the like on the regions partitioned by the partition sections on the first surface 21 of the holding member 20h. Alternatively, the holding member 20h may be partitioned into a plurality of regions by partition members constituting the partition section 20s, and the red phosphor sections 20r in which the red phosphor is mixed with a filler, the green phosphor sections 20g in which the green phosphor is mixed with a filler, and the blue phosphor sections 20b in which the blue phosphor is mixed with a filler, may be formed at the region partitioned by the partition members.

In the phosphor layer 20L of the present embodiment, the surface area of each phosphor section in the second surface 22 of the holding member 20h is determined on the basis of the excitation light ratio. More specifically, for example, the surface area of each phosphor section is determined by the surface area ratio corresponding to the compounding ratio of the phosphors corresponding to each excitation light ratio shown in FIG. 8. The phosphor sections may be provided with different surface area ratios by selecting regions of different size for each color of the phosphor sections, or by selecting the different number of regions for each color of the phosphor sections. The mixing ratio of the filler with each phosphor may be also made to differ on the basis of the excitation light ratio.

Further, the space between the first surface 21 of the phosphor layer 20L and the upper surface 10a of the LED chip 10 is filled, for example, with the sealing material 20j to a thickness equal to or greater than 0.1 mm and equal to or less than 500 mm. The phosphor layer 20L is supported by the holding member 20h so that the distance between the phosphor layer and the upper surface 10a of the LED chip 10 is equal to or greater than 0.1 mm and equal to or less than 500 mm.

For example, a material selected from alumina ceramic, ceramics, resins, glass epoxy, and composite resins including a filler in a resin may be used for the partition sections. In order to reflect and return the light inside the phosphor section of each color a silicon resin including a white pigment such as an alumina powder, a silica powder, magnesium oxide, or titanium oxide may be used.

The case in which the phosphor 20 is formed by mixing a green phosphor, a red phosphor, a blue phosphor, and a sealing material (the case in which the phosphors of each color are mixed) and the case in which the phosphor layer 20L is formed that includes the phosphor sections 20r, 20g, 20b of each color (the case in which the phosphors of each color are coated separately) are described above. In the case where the phosphors of each color are mixed, it is preferred that $(Sr,Ba,Ca)_5(PO_4)_3Cl:Eu$ be used as the blue phosphor. When the phosphors of each color are coated separately, it is preferred that $(Sr,Ba,Ca)_5(PO_4)_3Cl:Eu$ or $BaMgAl_{10}O_{17}:Eu$ be used as the blue phosphor.

The reason why it is preferred that $(Sr,Ba,Ca)_5(PO_4)_3Cl:Eu$ be used even when the phosphors of each color are mixed is explained below. When the phosphors of each color are mixed, cascade excitation occurs in which the blue fluorescence emitted by the blue phosphor is absorbed by the green phosphor and red phosphor. Further, the emission efficiency of the fluorescence obtained with $(Sr,Ba,Ca)_5(PO_4)_3Cl:Eu$ when the light with a wavelength of about 410 nm is used as the excitation light is higher than that in $BaMgAl_{10}O_{17}:Eu$. Accordingly, even when $(Sr,Ba,Ca)_5(PO_4)_3Cl:Eu$ is mixed with the phosphors of other colors and the blue fluorescence emitted by the $(Sr,Ba,Ca)_5(PO_4)_3Cl:Eu$ is absorbed by the phosphors of other colors due to the cascade excitation, the Blue fluorescence of the required intensity is emitted from the semiconductor light-emitting device 1. This is why it is preferred that $(Sr,Ba,Ca)_5(PO_4)_3Cl:Eu$ be used even when the phosphors of each color which produce cascade excitation are mixed.

REFERENCE EXAMPLE

The production results of white semiconductor light-emitting devices with excitation light ratios adjusted to predetermined values, a correlated color temperature of 2700 K, a duv of 0.00, and different excitation light ratios of the emitted light are described below. An InGaN ultraviolet light-emitting diode element with an emission peak wavelength of about 405 nm, a half-width of about 30 nm, and a corner of 350 μm is used as the LED chip 10. The emission peak wavelength and half-width are measured by using an integrating sphere. Further, β-Sialon is used as the green phosphor, $CaAlSi(N,O)_3:Eu$ is used as the red phosphor, and $(Sr_{1-x}Ba_x)_5(PO_4)_3Cl:Eu$ (x>0) is used as the blue phosphor.

The emission peak wavelength of the green phosphor is 542 nm and the half-width is 56 nm, the emission peak wavelength of the red phosphor is 640 nm and the half-width is 115 nm, and the emission peak wavelength of the blue phosphor is 475 nm and the half-width is 80 nm. The emission peak wavelength and half-width of each phosphor are measured by a spectrophotometer.

Each of the white semiconductor light-emitting devices is fabricated by mounting six violet light-emitting diode elements in a 5050 SMD-type alumina ceramic package and sealing with a silicone resin composition having a powder phosphor added thereto. Table 2 shows the content (concentration in wt %) of each phosphor in the silicone resin composition that seals the light-emitting diode elements used in each of the white semiconductor light-emitting devices. For example, the white semiconductor light-emitting device of Reference Example 1 has a structure in which a violet light-emitting diode element is sealed by a silicone resin composition including the blue phosphor, green phosphor, and red phosphor in concentrations of 1.5 wt %, 3.7 wt %, and 7.9 wt %, respectively, and including the phosphor mixture constituted by the blue phosphor, green phosphor, and red phosphor in a concentration of 13.0 wt %. Further, the white semiconductor light-emitting device of Reference Example 2 has a structure in which a violet light-emitting diode element is sealed by a silicone resin composition including the blue phosphor, green phosphor, and red phosphor in concentrations of 5.7 wt %, 3.8 wt %, and 9.9 wt %, respectively, and including the phosphor mixture constituted by the blue phosphor, green phosphor, and red phosphor in a concentration of 19.4 wt %. The white semiconductor light-emitting device of Reference Example 3 has a structure in which a violet light-emitting diode element is sealed by a silicone resin composition including the blue phosphor, green phosphor, and red phosphor in concentrations of 16.0 wt %, 3.5 wt %, and 10.5 wt %, respectively, and including the phosphor mixture constituted by the blue phosphor, green phosphor, and red phosphor in a concentration of 30.0 wt %.

TABLE 2

|  | Reference Example 1 | Reference Example 2 | Reference Example 3 |
| --- | --- | --- | --- |
| Excitation light ratio (%) | 175 | 79 | 23 |
| Blue phosphor content (wt %) | 1.5 | 5.7 | 16.0 |
| Green phosphor content (wt %) | 3.7 | 3.8 | 3.5 |
| Red phosphor content (wt %) | 7.9 | 9.9 | 10.5 |
| Phosphor content (wt %) | 13.0 | 19.4 | 30.0 |

As shown in Table 2, the excitation light ratio of the light emitted by the white semiconductor light-emitting device of Reference Example 1 is 175%, the excitation light ratio of the light emitted by the white semiconductor light-emitting device of Reference Example 2 is 79%, and the excitation light ratio of the light emitted by the white semiconductor light-emitting device of Reference Example 3 is 23%. It follows from Table 2 that the excitation light ratio can be adjusted, for example, by adjusting the content of the phosphor mixture in the silicone resin composition.

For example, a transparent resin material or glass material can be used for the silicone resin used as the sealing material for sealing the light-emitting diode element of the semiconductor light-emitting device. For example, a thermoplastic resin, a thermosetting resin, and a photocurable resin can be used as the transparent resin material, and it is preferred that a material be used that has sufficient transparency and durability with respect to the near-UV radiation emitted from the light-emitting diode element. Examples of such materials include (meth)acrylic resins such as polymethyl (meth)acrylate, styrene resins such as polystyrene and styrene-acrylonitrile copolymer, polycarbonate resins, polyester resins, phenoxy resins, butyral resins, polyvinyl alcohol, cellulose resins such as ethyl cellulose, cellulose acetate, and cellulose acetate butyrate, epoxy resins, phenolic resins, and silicone resins. For example, an inorganic material prepared by solidifying a metal alkoxide, a ceramic precursor polymer, or a solution obtained by hydrolytic polymerization of a solution including a metal alkoxide by a sol-gel method, or combinations thereof, for example, an inorganic material having a siloxane bond or glass can be used as the aforementioned inorganic materials.

Further, the sealing material may include a light-scattering agent. The light-scattering agent included in the sealing material is preferably in the form of inorganic particles, for example, of silica, titanium oxide, and aluminum oxide. When a light-scattering agent is included in the sealing material, where the amount of the light-scattering agent included in the sealing material is adjusted, the excitation light ratio can be adjusted without changing significantly the total amount of the phosphor contained in the sealing material or the compounding ratio of phosphors.

Figure 12:
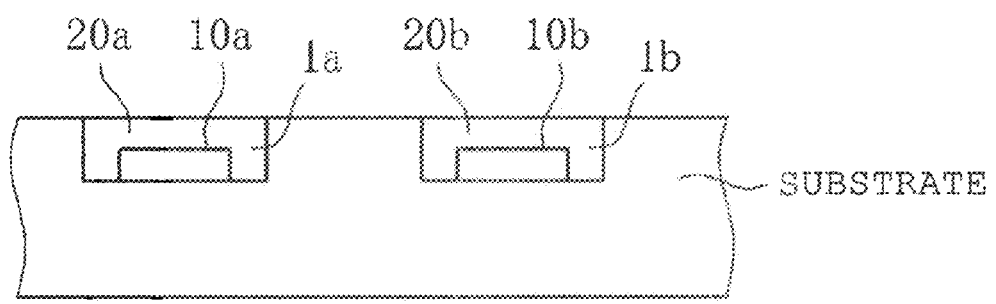
FIG. 12 is a schematic explanatory drawing illustrating an example of the semiconductor light-emitting system including semiconductor light-emitting devices emitting light rays with mutually different correlated color temperatures.

In the above-described embodiment, the combination light with a specific color temperature is obtained that has a correlated color temperature equal to or higher than 1600 K and lower than 2400, preferably lower than 2000 K, but a semiconductor light-emitting system may be also configured that includes semiconductor light-emitting devices emitting light rays with mutually different correlated color temperatures. FIG. 12 is a schematic explanatory drawing illustrating an example of the semiconductor light-emitting system including semiconductor light-emitting devices emitting light rays with mutually different correlated color temperatures. In the example shown in FIG. 12, a semiconductor light-emitting device 1a and a semiconductor light-emitting device 1b emitting light rays with mutually different correlated color temperatures are arranged side by side. The semiconductor light-emitting device 1a includes a LED chip 10a and a phosphor 20a. The semiconductor light-emitting device 1b includes a LED chip 10b and a phosphor 20b.

The semiconductor light-emitting device 1a shown in FIG. 12 has a configuration similar to that of the semiconductor light-emitting device 1 of the above-described embodiment and, for example, emits light with a correlated color temperature of 1900 K (in other words, of candle color). The semiconductor light-emitting device 1b emits light with a correlated color temperature equal to or higher than 2000 K, which is a correlated color temperature other than 1900 K (in other words, color other than the candle color), preferably equal to or higher than 2400 K and equal to or lower than 6700 K. The correlated color temperature difference, which is the difference between the correlated color temperature of the light emitted by the semiconductor light-emitting device 1a and the correlated color temperature of the light emitted by the semiconductor light-emitting device 1b, is preferably equal to or higher than 2000 K, more preferably equal to or higher than 3000 K, even more preferably equal to or higher than 3500 K. More specifically, for example, the correlated color temperature of the light emitted by the semiconductor light-emitting device 1a is 1900 K, and the correlated color temperature of the light emitted by the semiconductor light-emitting device 1b is 2700 K, 5000 K, or 6700 K. With such a configuration, it is possible to realize a semiconductor light-emitting system in which the correlated color temperature of the combination light obtained by combining light rays of two semiconductor light-emitting devices can be adjusted between the correlated color temperature of the light emitted by the semiconductor light-emitting device 1a (for example 1900 K) and the correlated color temperature of the light emitted by the semiconductor light-emitting device 1b (for example, any of the 2700 K, 5000 K, and 6700 K) by adjusting the intensity of the light emitted by the semiconductor light-emitting device 1a and the intensity of the light emitted by the semiconductor light-emitting device 1b by controlling the amount of electric current flowing in the LED chip of each semiconductor light-emitting device.

Figure 13:
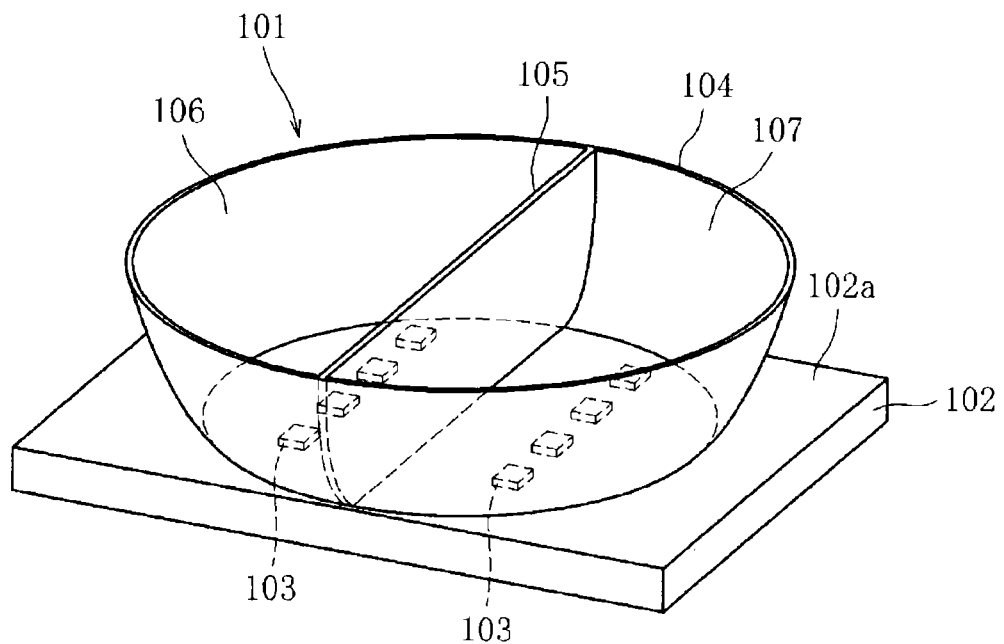
FIG. 13 is a schematic explanatory drawing illustrating another example of the semiconductor light-emitting system including semiconductor light-emitting devices emitting light rays with mutually different correlated color temperatures.

FIG. 13 illustrates yet another example of the semiconductor light-emitting system having the semiconductor light-emitting device 1a and the semiconductor light-emitting device 1b such as shown in FIG. 12. In the example shown in FIG. 13, a semiconductor light-emitting system 101 is provided with LED chips 103 that are mounted in two rows, each row including four chips, on a chip mounting surface 102a of a wiring board 102 constituted by alumina ceramic that excels in electric insulating property and has good heat dissipation ability. An annular reflector (wall member) 104 in the form of a truncated cone is also provided so as to surround those LED chips 103 on the chip mounting surface 102a of the wiring substrate 102.

As mentioned hereinabove, the semiconductor light-emitting device 1a has a value of general color rendering index Ra preferably equal to or greater than 86, more preferably equal to or greater than 88, even more preferably equal to or greater than 90, and particularly preferably equal to or greater than 92. The semiconductor light-emitting device 1b has a value of general color rendering index Ra preferably equal to or greater than 86, more preferably equal to or greater than 88, even more preferably equal to or greater than 90, and particularly preferably equal to or greater than 92. In particular, fluctuations of the general color rendering index Ra in the process of adjusting the color temperature can be reduced by setting the general color rendering index Ra of the semiconductor light-emitting device 1a to any of the above-described preferred values and setting the general color rendering index Ra of the semiconductor light-emitting device 1b to any of the above-described preferred values.

The interior of the reflector 104 is divided by a partition member 105 into a first region 106 and a second region 107, and the respective phosphors are loaded in a state of a mixture with a filler into each region. More specifically, a phosphor emitting, for example, the light with a correlated color temperature of 1900 K is loaded into the first region 106 in the same manner as in the semiconductor light-emitting device 1 in the above-described embodiment and the above-described semiconductor light-emitting device 1a, and a phosphor emitting, for example, the light with a correlated color temperature of 2700 K, 5000 K, or 6700 K is loaded into the second region 107 in the same manner as in the above-described semiconductor light-emitting device 1b. Therefore, in the first region 106, the semiconductor light-emitting device 1a is constituted by the LED chips 103 and the phosphor loaded into the first region 106, and in the second region 107, the semiconductor light-emitting device 1b is constituted by the LED chips 103 and the phosphor loaded into the second region 107. The reflector 104 and the partition member 105 can be formed from a resin, a metal or a ceramic and are fixed to the wiring board 102 with an adhesive or the like. When an electrically conductive material is used for the reflector 104 and the partition member 105, a treatment should be performed to ensure electric insulation from the wiring pattern.

The number of the LED chips 103 shown in FIG. 13 is merely exemplary and can be increased or decreased as necessary. The chips can be loaded by one into the first region 106 and the second region 107, or the number of chips in one region can differ from that in the other region. Further, the material of the wiring board 102 is not limited to alumina ceramic and a variety of other materials can be used. For example, a material selected from ceramics, resins, glass epoxy, and composite resins in which a filler is contained in a resin may be used. From the standpoint of improving the light reflection ability on the chip mounting surface 102a of the wiring board 102 and increasing the emission efficiency of the semiconductor light-emitting system, it is preferred that a silicon resin including a white pigment such as an alumina powder, a silica powder, magnesium oxide, and titanium oxide be used. Meanwhile, by using a metal substrate such as a copper substrate or an aluminum substrate, it is possible to improve heat radiation ability. However, in this case, an electric insulator should be interposed between the wiring board and the wiring pattern formed thereon.

The shapes of the above-described reflector 104 and partition member 105 are also exemplary and can be variously changed, as necessary. For example, instead of the pre-molded reflector 104 and partition member 105, it is possible to form an annular wall section (wall member) corresponding to the reflector 104 on the chip mounting surface 102a of the wiring board 102 by using a dispenser or the like, and then form a partition wall (partition member) corresponding to the partition member 105. In this case, for example, a paste-like thermosetting resin material or a UV-curable resin material can be used for the annular wall section and partition wall section, and a silicone resin including an inorganic filler is preferred.

With the configuration shown in FIG. 13, the correlated color temperature of the combination light emitted by the semiconductor light-emitting system can be adjusted between the correlated color temperature (for example, 1900 K) of the light emitted by the semiconductor light-emitting device 1a disposed in the first region 106 and the correlated color temperature (for example, any of 2700 K, 5000 K, and 6700 K) of the light emitted by the semiconductor light-emitting device 1b disposed in the second region 107 by controlling the amount of electric current flowing in the semiconductor light-emitting device 1a and the semiconductor light-emitting device 1b.

In the configuration shown in FIG. 13, instead of loading the phosphors into the first region 106 and the second region 107, it is possible to coat the phosphors on a transparent member and dispose above the LED chips 103.

Figure 14:
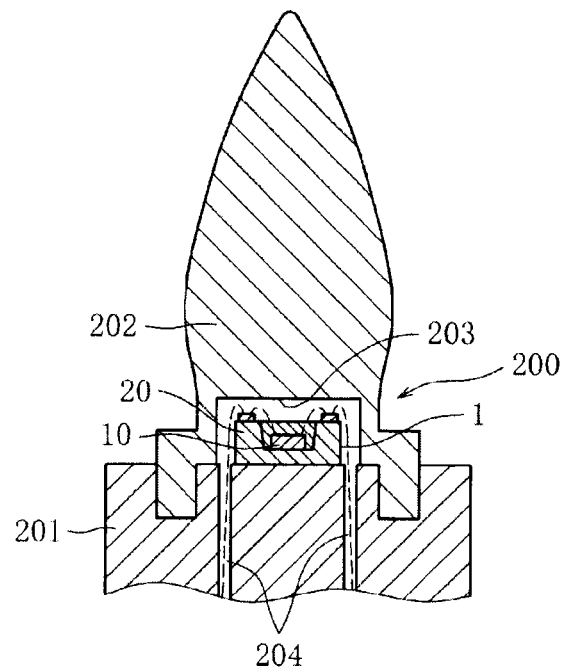
FIG. 14 is a schematic cross-section view illustrating a configuration example of the illumination fixture including the semiconductor light-emitting device of the above-described embodiment.

FIG. 14 is a schematic cross-sectional view illustrating a configuration example of an illumination fixture 200 including the semiconductor light-emitting device 1 of the above-described embodiment. In the illumination fixture 200 of the example shown in FIG. 14, the semiconductor light-emitting device 1 is disposed on the upper surface of a base member 201. The cover member 202 is disposed at a position through which passes the light emitted by the semiconductor light-emitting device 1. In the example shown in FIG. 14, the cover member 202 simulates the outer shape of candle flame, and a recess 203 facing upward is provided in the bottom surface. The semiconductor light-emitting device 1 is disposed in a section surrounded by the top surface for the recess 203 and the inner wall of the cover member 202 that is formed by providing the recess 203 in the cover member 202 between the bottom surface of the cover member 202 and the upper surface of the base member 201.

Electric power for light emission is supplied to the LED chip 10 by a cable 204. As a result, the LED chip 10 emits light, and the phosphor 20 is excited by the light emitted by the LED chip 10 and emits fluorescence. The semiconductor light-emitting device 1 including the LED chip 10 and the phosphor 20 radiates the candle color light which is the combination light of the light emitted by the LED chip 10 and the fluorescence to the outside through the cover member 202.

With such a configuration, since the semiconductor light-emitting device 1 radiates the candle color light to the outside through the cover member 202, it seems that the illumination fixture 200 emits the candle color light and that the cover member 202 simulating the outer shape of candle flame emits the candle color light. Therefore, the illumination fixture 200 can be lit on to simulate the candle flame.

FIG. 14 illustrates an example in which the semiconductor light-emitting device 1 is disposed that includes the phosphor 20 obtained by mixing phosphors of various colors, but the semiconductor light-emitting device 11 in which the phosphor layer 20L is formed by separately coating the phosphors of each color, as shown in FIG. 11, may be also disposed.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS 1, 1a, 1b, 11 semiconductor light-emitting devices
10, 10a, 10b, 103 LED chips
20, 20a, 20b phosphors
20r red phosphor
20g green phosphor
20b blue phosphor
20L phosphor layer
20k substrate
20h holding member
20s partition section
20j sealing material
101 semiconductor light-emitting system
102 wiring board
102a chip mounting surface
104 reflector
105 partition member
106 first region
107 second region
200 illumination fixture
201 base member
202 cover member
203 recess
204 cable

The invention claimed is:

1. A semiconductor light-emitting device comprising:
a semiconductor light-emitting element radiating light having an emission peak equal to or higher than 380 nm and equal to or lower than 430 nm; and
a phosphor that emits light using the semiconductor light-emitting element as an excitation source,
the semiconductor light-emitting device emitting light with a correlated color temperature equal to or higher than 1600 K and lower than 2400 K, wherein
the phosphor includes at least a blue phosphor, a green phosphor, and a red phosphor, and
in a spectrum of light emitted from the semiconductor light-emitting device, a value of a peak intensity of the light emitted by the semiconductor light-emitting element is less than 60% of the maximum peak intensity of the light emitted by the phosphor, and the maximum peak of the light emitted by the phosphor is at a position equal to or greater than 600 nm and equal to or less than 660 nm.

2. The semiconductor light-emitting device according to claim 1, which emits light with a spectrum such that the value of the peak intensity of the light emitted by the light-emitting element is equal to or greater than 5% of the maximum peak intensity of the light emitted by the phosphor.

3. The semiconductor light-emitting device according to claim 1 or 2, which emits light with the correlated color temperature equal to or higher than 1600 K and lower than 2000 K.

4. The semiconductor light-emitting device according to any one of claim 1 or 2, wherein
the blue phosphor has a half-width of emission peak wavelength of equal to or greater than 30 nm.

5. The semiconductor light-emitting device according to any one of claim 1 or 2, wherein
the blue phosphor is $(Sr,Ba,Ca)_5(PO_4)_3Cl:Eu$, or $BaMgAl_{10}O_{17}:Eu$.

6. The semiconductor light-emitting device according to any one of claim 1 or 2, wherein
a chromaticity coordinate of the light emitted by the semiconductor light-emitting device has a value of a deviation duv from a black body radiation trajectory curve of equal to or greater than −0.02 and equal to or less than 0.02 in a XY chromaticity diagram of a CIE (1931) XYZ color system.

7. The semiconductor light-emitting device according to any one of claim 1 or 2, wherein
the green phosphor is β-Sialon, $(Ba,Sr)_3Si_6O_{12}N_2:Eu$, or $(Sr,Ba)_2SiO_4:Eu$.

8. The semiconductor light-emitting device according to any one of claim 1 or 2, wherein
the red phosphor includes $(CaAlSiN_3)_{1-x}(Si_2N_2O)_x:Eu$ (x satisfies the condition 0<x<0.5).

9. The semiconductor light-emitting device according to any one of claim 1 or 2, wherein
the red phosphor includes $K_2SiF_6:Mn$.

10. The semiconductor light-emitting device according to any one of claim 1 or 2, wherein
the red phosphor includes $A_{2+x}M_yMn_zF_n$ (where A is either or both of Na and K, M is Si and Al, and the following conditions are satisfied: −1≤x≤1; 0.9≤y+z≤1.1, 0.001≤z≤0.4, and 5≤n≤7).

11. The semiconductor light-emitting device according to any one of claim 1 or 2, wherein
the phosphor transmits the light emitted by the semiconductor light-emitting element with a predetermined transmittance and radiates the transmitted light to the outside of the light-emitting device.

12. The semiconductor light-emitting device according to any one of claim 1 or 2, further comprising a holding member that holds the phosphor, wherein
the holding member is configured such that the phosphor of each color is held in a predetermined region that is set for each color, and a phosphor layer is formed in which the regions where the phosphors are held for the respective colors are arranged, and
the phosphor layer is supported at a distance equal to or greater than 0.1 mm and equal to or less than 500 mm from the semiconductor light-emitting element.

13. A semiconductor light-emitting system comprising:
the semiconductor light-emitting device according to any one of claim 1 or 2 as a first semiconductor light-emitting device; and
a semiconductor light-emitting device that emits light with a correlated color temperature different from that of the light emitted by the first semiconductor light-emitting device, as a second semiconductor light-emitting device.

14. The semiconductor light-emitting system according to claim 13, wherein
a value of a general color rendering index Ra of the first semiconductor light-emitting device is equal to or greater than 86, and a value of a general color rendering index Ra of the second semiconductor light-emitting device is equal to or greater than 86.

15. An illumination fixture, comprising the semiconductor light-emitting device according to any one of claim 1 or 2.

* * * * *